(12) United States Patent
Marechal et al.

(10) Patent No.: US 9,029,928 B2
(45) Date of Patent: May 12, 2015

(54) SEMICONDUCTOR DEVICE COMPRISING A PASSIVE COMPONENT OF CAPACITORS AND PROCESS FOR FABRICATION

(75) Inventors: Laurent Marechal, Grenoble (FR); Yvon Imbs, Quaix en Chartreuse (FR); Romain Coffy, Saint Martin le Vinoux (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 511 days.

(21) Appl. No.: 13/179,640

(22) Filed: Jul. 11, 2011

(65) Prior Publication Data
US 2012/0025348 A1 Feb. 2, 2012

(30) Foreign Application Priority Data
Jul. 27, 2010 (FR) ...................... 10 56159

(51) Int. Cl.
*H01L 27/108* (2006.01)
*H01L 29/94* (2006.01)
(Continued)

(52) U.S. Cl.
CPC ............. *H01L 21/56* (2013.01); *H01L 23/5383* (2013.01); *H01L 23/5389* (2013.01); *H01L 24/18* (2013.01); *H01L 24/82* (2013.01); *H01L 24/96* (2013.01); *H01L 24/97* (2013.01); *H01L 2224/18* (2013.01); *H01L 2224/97* (2013.01); *H01L 2924/01058* (2013.01); *H01L 2924/15311* (2013.01); *H05K 1/185* (2013.01); *H05K 2201/10015* (2013.01); *H05K 2201/10674* (2013.01); *H05K 2203/1469* (2013.01); *H01L 2924/01033* (2013.01); *H01L 23/642* (2013.01); *H01L 25/16* (2013.01)

(58) Field of Classification Search
USPC .......... 257/532, 621, 700, E23.178, E23.021, 257/E23.011, E27.027, E27.03, E27.031, 257/E27.034, E27.116, 112, 114, 171, 329, 257/381, 523, E21.505, E21.506; 361/301.3, 306.3, 763
See application file for complete search history.

(56) References Cited

U.S. PATENT DOCUMENTS 3,699,011 A    10/1972  Nishimura
5,027,253 A     6/1991  Lauffer et al.
(Continued)

FOREIGN PATENT DOCUMENTS

KR         100616384 B1      8/2006

OTHER PUBLICATIONS

French Search Report and Written Opinion for FR 1056159 mailed Apr. 20, 2011 (8 pages).

*Primary Examiner* — Mohsen Ahmadi
(74) *Attorney, Agent, or Firm* — Gardere Wynne Sewell LLP

(57) ABSTRACT

A semiconductor device includes a wafer having a frontside and a backside. The wafer is formed from at least one integrated circuit chip having an electrical connection frontside co-planar with the wafer frontside and a backside co-planar with the wafer backside. A passive component including at least one conductive plate and a dielectric plate is positioned adjacent the integrated circuit chip. An encapsulation block embeds the integrated circuit chip and the passive component, the block having a frontside co-planar with the wafer frontside and a backside co-planar with the wafer backside. An electrical connection is made between the electrical connection frontside and the passive component. That electrical connection includes connection lines placed on the wafer frontside and wafer backside. The electrical connection further includes at least one via passing through the encapsulation block.

10 Claims, 4 Drawing Sheets

(51) Int. Cl.
*H01L 29/40* (2006.01)
*H01L 23/12* (2006.01)
*H01L 23/053* (2006.01)
*H01L 21/56* (2006.01)
*H01L 23/00* (2006.01)
*H01L 23/64* (2006.01)
*H01L 25/16* (2006.01)
*H01L 23/538* (2006.01)
*H05K 1/18* (2006.01)

(56) References Cited

U.S. PATENT DOCUMENTS

| | | | | |
|---|---|---|---|---|
| 5,497,033 | A * | 3/1996 | Fillion et al. | 257/723 |
| 6,239,980 | B1 * | 5/2001 | Fillion et al. | 361/760 |
| 6,914,322 | B2 * | 7/2005 | Iijima et al. | 257/678 |
| 7,280,342 | B1 * | 10/2007 | Randall et al. | 361/303 |
| 7,897,817 | B2 * | 3/2011 | Uozumi et al. | 568/303 |
| 7,897,877 | B2 | 3/2011 | Das et al. | |
| 8,107,253 | B2 * | 1/2012 | Inagaki et al. | 361/763 |
| 8,168,473 | B2 | 5/2012 | Liu | |
| 8,212,342 | B2 * | 7/2012 | Camacho et al. | 257/676 |
| 2005/0007723 | A1 * | 1/2005 | Mosley | 361/306.1 |
| 2005/0117272 | A1 * | 6/2005 | Koutsaroff et al. | 361/306.3 |
| 2005/0128720 | A1 | 6/2005 | Croswell et al. | |
| 2005/0269128 | A1 | 12/2005 | Usui et al. | |
| 2006/0002097 | A1 | 1/2006 | Borland et al. | |
| 2006/0158804 | A1 | 7/2006 | Usui et al. | |
| 2006/0198079 | A1 * | 9/2006 | Shim et al. | 361/306.3 |
| 2006/0207970 | A1 | 9/2006 | Dunn et al. | |
| 2006/0220167 | A1 * | 10/2006 | Min et al. | 257/499 |
| 2007/0010065 | A1 * | 1/2007 | Das et al. | 438/393 |
| 2007/0139859 | A1 * | 6/2007 | Osaka et al. | 361/301.1 |
| 2008/0273313 | A1 | 11/2008 | Wang et al. | |
| 2009/0073667 | A1 * | 3/2009 | Chung et al. | 361/763 |
| 2009/0140394 | A1 | 6/2009 | Bathan et al. | |
| 2009/0201624 | A1 * | 8/2009 | Hattori et al. | 361/301.3 |
| 2009/0201626 | A1 * | 8/2009 | Ayotte et al. | 361/306.3 |
| 2009/0294899 | A1 * | 12/2009 | Pagaila et al. | 257/528 |
| 2010/0148316 | A1 * | 6/2010 | Kim et al. | 257/621 |

* cited by examiner

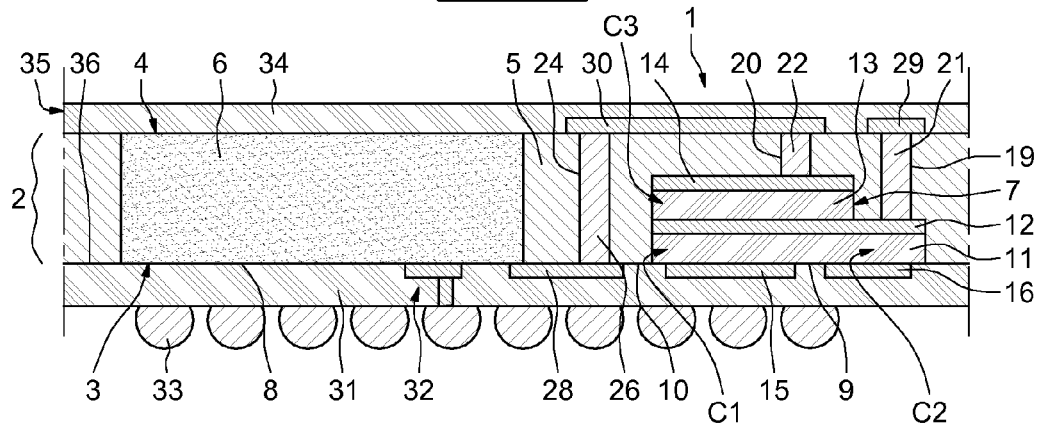
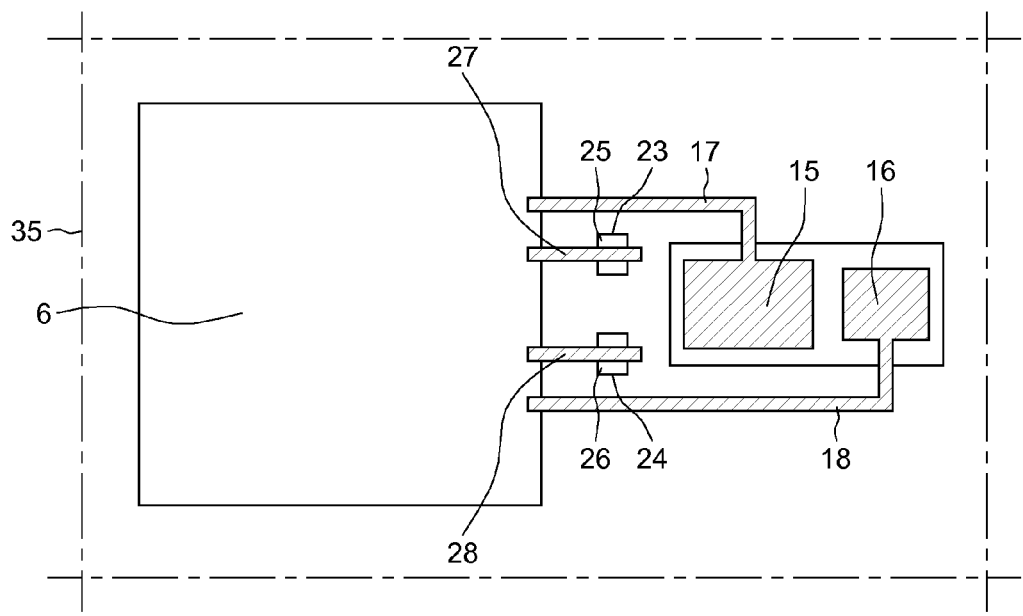
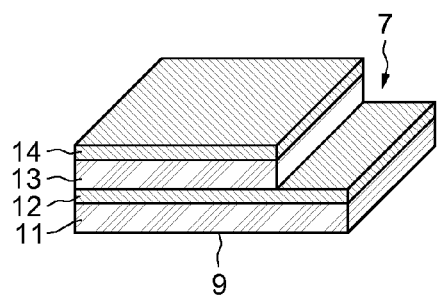

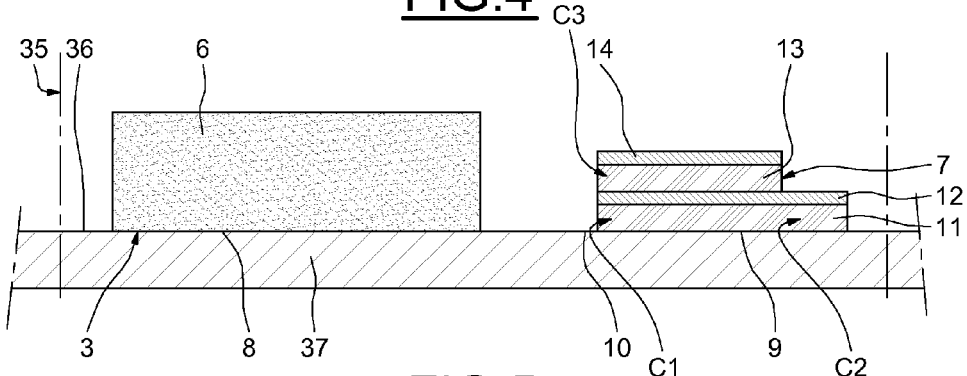
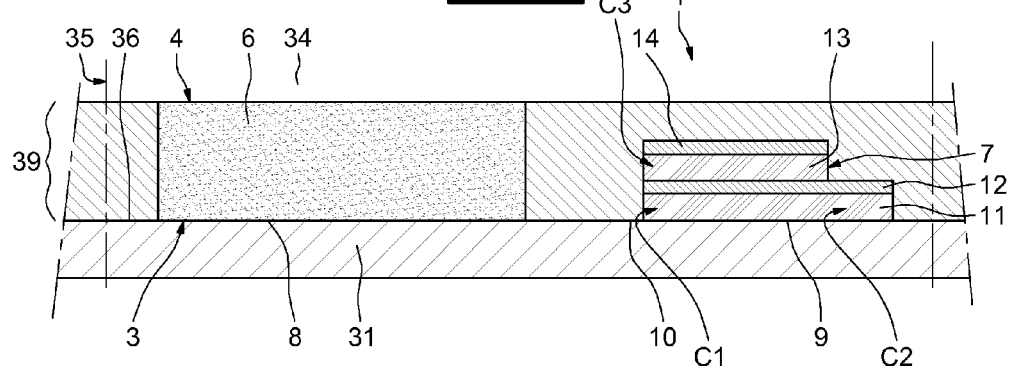
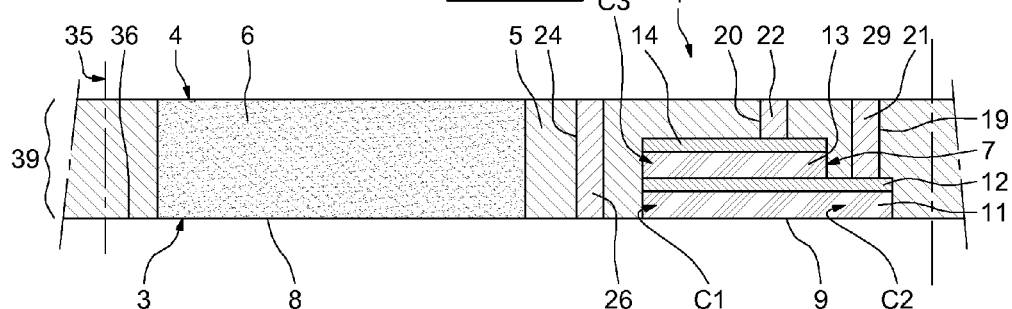
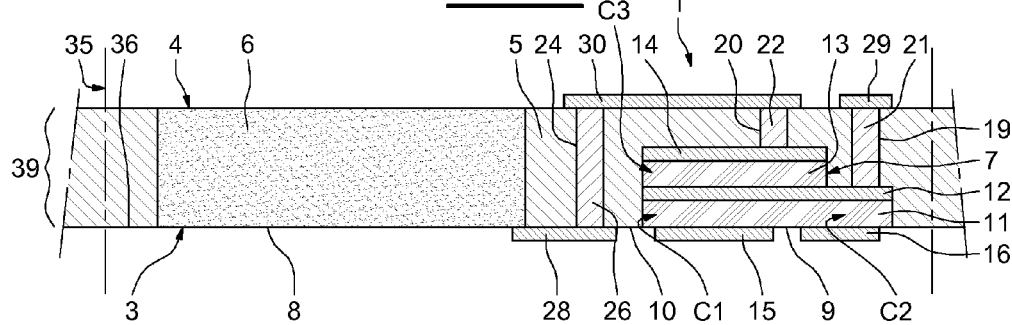

SEMICONDUCTOR DEVICE COMPRISING A PASSIVE COMPONENT OF CAPACITORS AND PROCESS FOR FABRICATION

PRIORITY CLAIM

This application claims priority from French Application for Patent No. 1056159 filed Jul. 27, 2010, the disclosure of which is hereby incorporated by reference.

TECHNICAL FIELD

The present invention relates to the field of semiconductor devices.

BACKGROUND

It is known to produce reconstituted wafers comprising, in locations, integrated circuit chips embedded in an encapsulation material and to saw these wafers so as to form individual semiconductor devices.

Nevertheless, it is not possible at the present time to integrate into the wafers, near the chips, capacitors such as those currently used, especially due to their shape and their electrical connection means.

SUMMARY

A process for fabricating a semiconductor device is provided.

This process comprises: placing, in at least one location on a receiving surface of a carrier, an electrical connection frontside of at least one integrated circuit chip and a frontside of at least one passive component comprising conductive plates separated by dielectric plates forming capacitors; forming on said receiving surface a layer of an encapsulation material so as to obtain, in said location, a wafer comprising an encapsulation block in which the chip and the passive component are embedded and having a frontside comprising the frontside of the chip and the frontside of the passive component; then selectively connecting at least some of said conductive plates to the chip, so that at least some of the capacitors are connected to the chip.

It is thus possible to prefabricate a passive component having a simple structure, to integrate it into the encapsulation block, and then to form one or more capacitors, as required, when electrical connections are made to the chip.

The process may comprise: forming at least one front electrical connection track on the frontside of the wafer.

The process may comprise: forming at least one back electrical connection track on the backside of the wafer, an electrical connection via through the wafer and a front electrical connection track on the frontside of the wafer, the back track and the front track being connected by the electrical connection via.

The process may comprise: placing the passive component such that said plates extend perpendicularly to said receiving surface, then selectively connecting at least some of the lands of said conductive plates to the chip.

The process may comprise: placing the passive component such that said plates extend parallel to said receiving surface.

The process may comprise: placing a passive component having a dielectric plate on the receiving surface, then forming at least one additional conductive plate on the frontside of this dielectric plate so as to form a capacitor comprising this conductive plate and the adjacent conductive plate of the passive component, which are separated by this first dielectric plate.

A semiconductor device is also provided, which comprises a wafer having a frontside and comprising at least one integrated circuit chip having an electrical connection frontside, at least one passive component having a frontside and comprising conductive plates separated by dielectric plates, forming capacitors, and an encapsulation block in which the integrated circuit chip and the passive component are embedded, a frontside of the encapsulation block, the frontside of the integrated circuit chip and the frontside of the passive component forming the frontside of the wafer; and electrical connection means connecting at least some of said conductive plates and the integrated circuit chip, these electrical connection means being formed on the frontside of the wafer and/or on the backside of the wafer, through the encapsulation block and on the frontside of the wafer.

The passive component may comprise plates which extend perpendicularly to the frontside of the wafer, the electrical connection means being connected to the lands of the conductive plates.

Said plates may extend through the thickness of the wafer.

The passive component may comprise plates which extend parallel to the frontside of the wafer.

The passive component may comprise a dielectric plate adjacent to the frontside of the wafer, at least one conductive plate being formed on the frontside of this dielectric plate.

BRIEF DESCRIPTION OF THE DRAWINGS

Semiconductor devices will now be described by way of non-limiting example, illustrated by the drawings in which:

FIG. 1 shows a cross section of a semiconductor device;

FIG. 2 shows a front view of the semiconductor device in FIG. 1, without a surface layer;

FIG. 3 shows a perspective view of a passive component of the semiconductor device in FIG. 1;

FIG. 4 shows the semiconductor device in FIG. 1, according to one fabrication step;

FIG. 5 shows the semiconductor device in FIG. 1, according to another fabrication step;

FIG. 6 shows the semiconductor device in FIG. 1, according to another fabrication step;

FIG. 7 shows the semiconductor device in FIG. 1, according to another fabrication step;

DETAILED DESCRIPTION OF THE DRAWINGS

Figure 8:
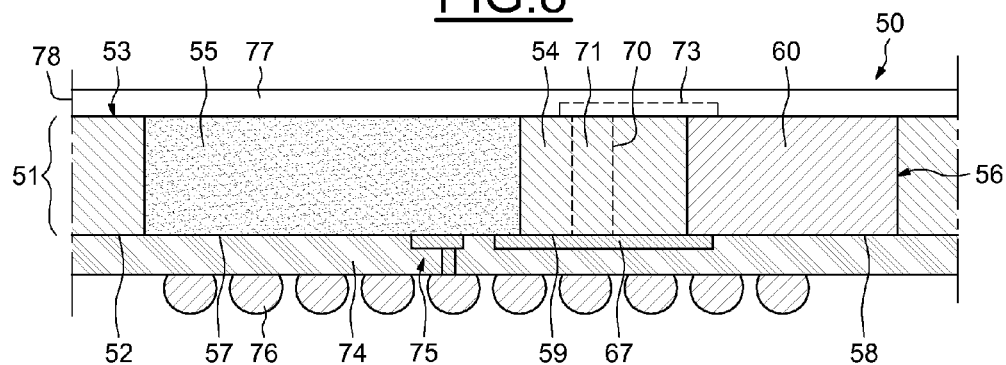
FIG. 8 shows a cross section of another semiconductor device.

A semiconductor device 1 illustrated in FIGS. 1 to 3 comprises a wafer 2 which has a frontside 3 and a backside 4, in parallel.

The wafer 2 comprises a block of a dielectric encapsulation material 5 in which a prefabricated integrated circuit chip 6 and a prefabricated passive component 7 are embedded, these being placed so that a frontside 8 of the chip 6, in which the integrated circuits are formed and which has electrical connection pads, a frontside 9 of the passive component 7 and a frontside 10 of the encapsulation block 5 are in the same plane forming the frontside 3 of the wafer 2, the passive component 7 being placed at a distance to the side of the chip 6. Thus, the frontside 8 of the chip 6 and the frontside 9 of the passive component 7 are not covered by the encapsulation block 5.

The passive component 7 comprises a plurality of superposed plates, which are placed parallel to the frontside 3 of the wafer 2. According to the example shown, the passive component 7 comprises in succession, in the thickness direction of the wafer 2, a dielectric plate 11 having the aforementioned side 9, a conductive plate 12, a dielectric plate 13 and a conductive plate 14, the conductive plates 12 and 14 being for example metallic. The plate 12 completely covers the plate 11, the plate 13 does not completely cover the plate 12 and the plate 14 completely covers the plate 13, the conductive plate 14 being, in the example shown, distant from the backside 4 of the wafer 2.

On the frontside 3 of the wafer 2, two conductive front plates 15 and 16 are formed, which are connected to electrical connection pads on the frontside 8 of the chip 6 by front electrical connection tracks 17 and 18, the conductive plates 15 and 16 being located on the frontside 9 of the dielectric plate 11 and being distant from each other. The conductive front plates 15 and 16 have the same thickness as the front electrical connection tracks 17 and 18.

Behind the plates 12 and 14, and between these plates 12 and 14 and the backside 4 of the wafer 2, holes 19 and 20 are provided in the encapsulation block 5, which are filled with a conductive material so as to form electrical connection vias 21 and 22.

According to one variant, the passive component 7 could have the same thickness as the wafer 2. In this case, the electrical connection via 22 could be omitted.

To the side of the chip 6 and the passive component 7, and between the frontside 3 and the backside 4 of the wafer 2, through-holes 23 and 24 are provided in the encapsulation block 5 and are filled with a conductive material so as to form electrical connection vias 25 and 26.

On the frontside 3 of the wafer 2, front electrical connection tracks 27 and 28 are formed connecting the vias 25 and 26, respectively, to electrical connection pads on the frontside 8 of the chip 6 and, on the backside 4 of the wafer 2, back electrical connection tracks 29 and 30 are formed connecting the vias 21 and 22 to the vias 25 and 26, respectively.

Thus, the passive component 7 defines three capacitors connected to the chip 6, namely a first capacitor C1 comprising the conductive plate 12 and the conductive plate 15 which are separated by the dielectric plate 11, a second capacitor C2 comprising the conductive plate 12 and the conductive plate 16 which are separated by the dielectric plate 11, and a third capacitor C3 comprising the conductive plates 12 and 14 which are separated by the dielectric plate 13.

On the frontside 3 of the wafer 2, and covering the conductive plates 15 and 16 and the electrical connection tracks 17, 18, 27 and 28, a dielectric layer 31 is provided, incorporating an electrical connection network 32 allowing electrical connection pads, on the frontside 8 of the chip 6, and external electrical connection bumps 33, placed on a frontside of the layer 31, to be selectively connected.

A protective dielectric layer 34 is provided on the backside 4 of the wafer 2, covering the electrical connection tracks 29 and 30.

The semiconductor device 1 may be produced in the following way, by suitably employing means used in the microelectronics field.

As illustrated in FIG. 4, in respective adjacent, for example square, locations 35 in a receiving surface 36 of a carrier 37, chips 6 and passive components 7 are placed, their frontsides 8 and 9 being placed against the receiving surface 36, the receiving surface 36 being for example self-adhesive.

As illustrated in FIG. 5, an encapsulation layer 38 is formed on the receiving surface 36 of the carrier 37, embedding the chips 6 and the passive components 7 and this layer 38 is then leveled or thinned, for example as far as the backside of the chips 6, so as to obtain a large reconstituted wafer 39 forming, respectively in the locations 35, encapsulation blocks 5 holding chips 6 and passive components 7.

Then, as illustrated in FIG. 6, holes 19, 20, 23 and 24 are produced, respectively in the locations 35, in the encapsulation layer 38 and these holes are filled with a conductive material so as to form vias 21, 22, 25 and 26, respectively, in the encapsulation blocks 5.

Then, as partially illustrated in FIG. 7 and more fully shown in FIG. 1, the layer 31 is produced on the frontside 3 of the wafer 2, incorporating therein, respectively in the locations 35, and on the same metallization level, the conductive plates 15 and 16, the front electrical connection tracks 17, 18, 27 and 28 and the electrical connection network 32. An intermediate dielectric layer could be formed directly on the frontside of the wafer 2, the conductive plates 15 and 16, the front electrical connection tracks 17, 18, 27 and 28 and the electrical connection network 32 then being produced on this intermediate dielectric layer and passing through the latter in places where electrical connection is required. Moreover, the electrical connection network 32 could nevertheless comprise several metallic levels.

Then, on the backside 4 of the wafer 2, the layer 34 is produced, incorporating therein, in the locations 35 respectively, and on the same metallization level, the back electrical connection tracks 29 and 30.

Then, the electrical connection bumps 33 are placed on the front layer 31.

Finally, the large wafer 39 obtained is singulated, along the edges of the locations 35, for example by sawing, so as to obtain a plurality of semiconductor devices 1.

It follows from the above that when the conductive front plates 15 and 16 are produced, at the same time as the front electrical connection tracks 17 and 18, the capacitances of the capacitors C1 and C2 are defined, especially by choosing the areas of these plates 15 and 16. Of course, one or more capacitors could be produced by forming one or more conductive plates on the frontside 3, at the same time as one or more tracks for electrical connection to the chip 6.

In addition, being provided with a prefabricated passive component comprising several capacitors, only some of the capacitors could be connected, as a function of the chip 6 used and of the requirements related to the operation and applications of the latter.

Figure 9:
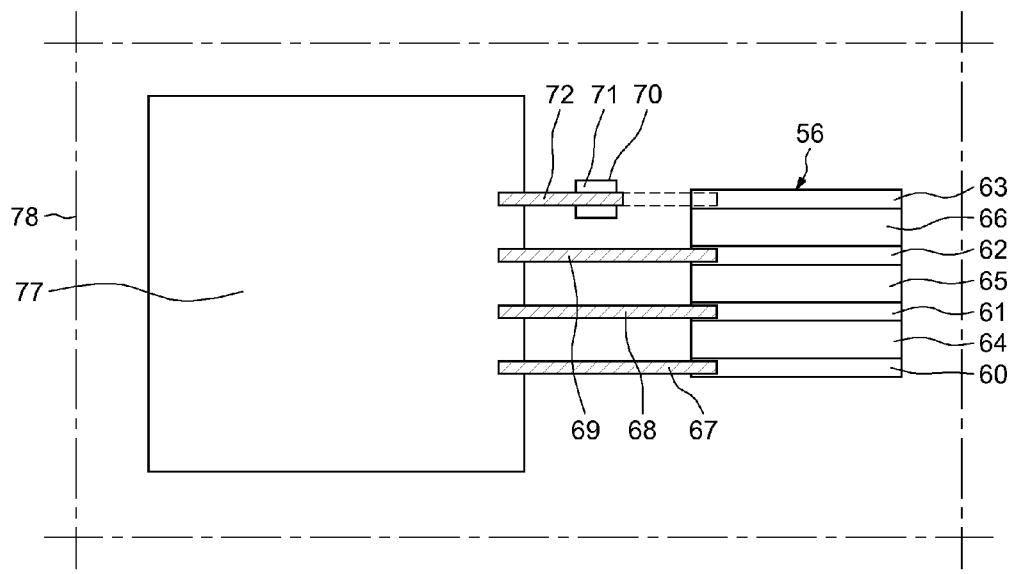
FIG. 9 shows a front view of the semiconductor device in FIG. 8, without a surface layer.
Figure 10:
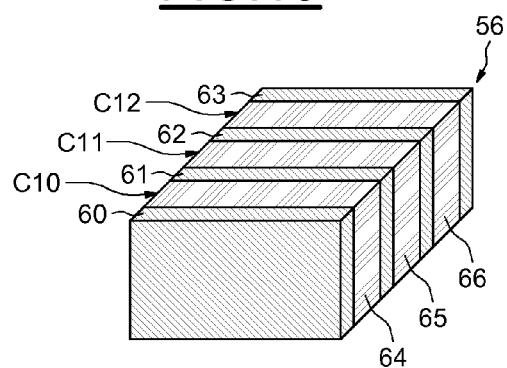
FIG. 10 shows a perspective view of a passive component of the semiconductor device in FIG. 8.

Another semiconductor device 50, illustrated in FIGS. 8 to 10, comprises a wafer 51 which has a frontside 52 and a backside 53, in parallel.

The wafer 51 comprises a block of an encapsulation material 54 in which a prefabricated integrated circuit chip 55 and a prefabricated passive component 56 are embedded, these being placed so that an electrical connection frontside 57 of the chip 55, a frontside 58 of the passive component 56, and a frontside 59 of the encapsulation block 5 are in the same plane formed by the frontside 52 of the wafer 51, the passive component 56 being placed at a distance to the side of the chip 55.

The passive component 56 comprises a plurality of superposed plates, placed perpendicular to the frontside 52 of the wafer 51. According to the example shown, the passive component 56 comprises four parallel, for example metallic, conductive plates 60, 61, 62 and 63, separated by three dielectric plates 64, 65 and 66, so as to form three capacitors C10, C11 and C12.

The conductive plates 60-63 and the dielectric plates 64-66 are placed so as to have front lands which form the side 58 of the passive component 56 in the plane of the frontside 57 of the wafer 51, and opposite back lands which are in the plane of the backside 53 of the wafer 51, the conductive plates 60-63 and the dielectric plates 64-66 consequently having, between these opposite lands, a width corresponding to the thickness of the wafer 51.

By way of example, the capacitors C10-C12 may be connected to the chip 55 in the following way.

For example, front electrical connection tracks 67, 68 and 69 may be formed on the frontside 52 of the wafer 51 so as to connect the front lands of the conductive plates 60, 61 and 62 to front pads of the chip 55, by extending onto these front lands and onto these pads, so that the capacitors C10 and C11 are connected to the chip 55 by the front tracks 67 and 68 and by the front tracks 68 and 69, respectively.

Furthermore, the encapsulation block 54 may have a through-hole 70 filled with a material forming an electrical connection via 71, a front electrical connection track 72 possibly being formed on the frontside 52 of the wafer 51 so as to connect the via 71 and a front pad of the chip 55, by extending over this via and this pad, and a back electrical connection track 73 possibly being formed on the backside 53 of the wafer 51 so as to connect the via 71 and the back land of the conductive plate 63, by extending over this via and this land, so that the capacitor C12 is connected to the chip 55 by the via 71, the front electrical connection track 72 and the back electrical connection track 73.

On the frontside 52 of the wafer 51, and covering the frontside of the passive component 56 and the front electrical connection tracks 67-69 and 72, a dielectric layer 74 is provided, incorporating an electrical connection network 75 allowing electrical connection pads, on the frontside 57 of the chip 55, and external electrical connection bumps 76, placed on a frontside of the layer 74, to be selectively connected.

A protective dielectric layer 77 is provided on the backside 53 of the wafer 51, covering the backside of the passive component 56 and the back electrical connection track 73.

The semiconductor device 50 may be produced in the following way.

Figure 11:
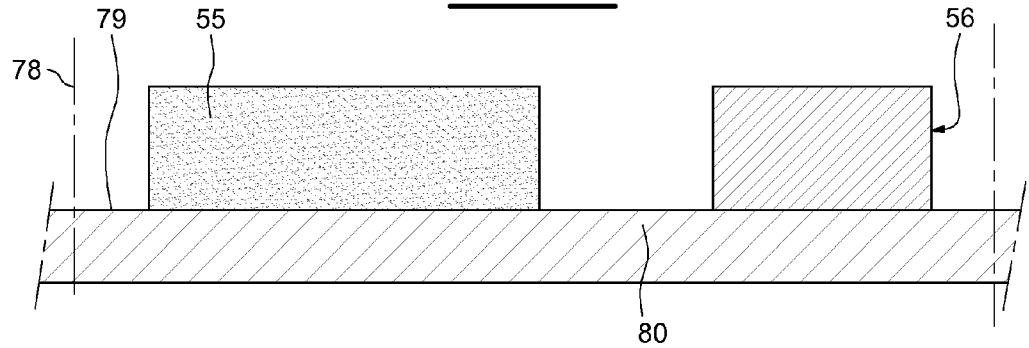
FIG. 11 shows the semiconductor device in FIG. 8, according to one fabrication step.

As illustrated in FIG. 11, in respective adjacent, for example square, locations 78 in a receiving surface 79 of a carrier 80, chips 55 and passive components 56 are placed, their frontsides 57 and 58 being placed against the receiving surface 79, the receiving surface 79 being for example self-adhesive.

Figure 12:
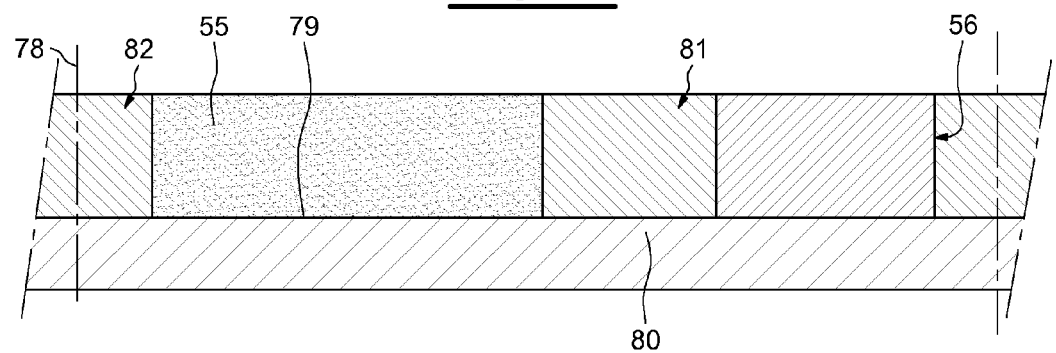
FIG. 12 shows the semiconductor device in FIG. 8, according to another fabrication step.

As illustrated in FIG. 12, an encapsulation layer 81 is formed on the receiving surface 79 of the carrier 80, embedding the chips 55 and the passive components 56 and this layer 81 is then leveled or thinned, until the backsides of the passive components 56 are exposed, so as to obtain a large reconstituted wafer 82 forming, respectively in the locations 78, encapsulation blocks 54 holding chips 55 and passive components 56.

Figure 13:
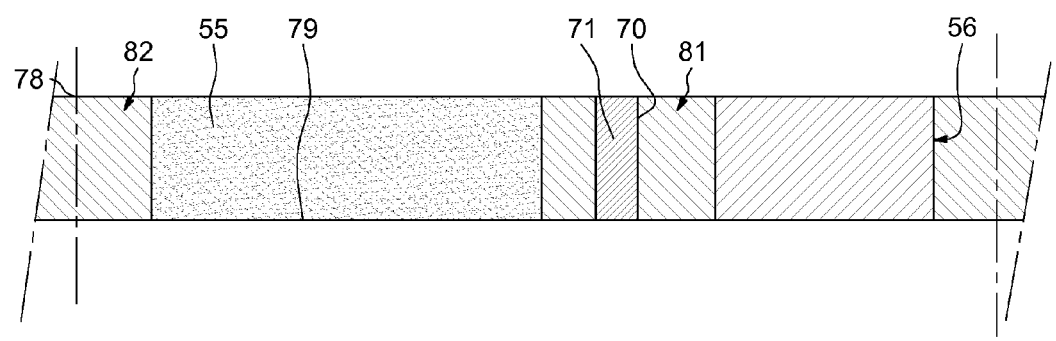
FIG. 13 shows the semiconductor device in FIG. 8, according to another fabrication step.

Then, as illustrated in FIG. 13, a hole 70 is produced, respectively in the locations 78, in the encapsulation layer 81 and this hole 70 is filled with a conductive material so as to form the via 71, respectively, in the encapsulation blocks 54.

Figure 14:
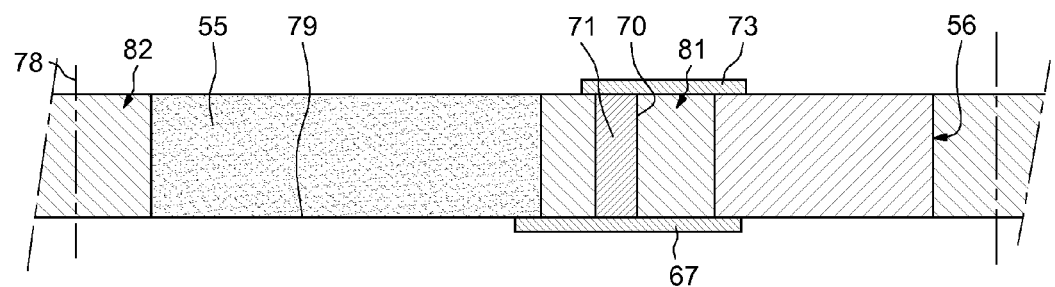
FIG. 14 shows the semiconductor device in FIG. 8, according to another fabrication step.

Then, as partially illustrated in FIG. 14 and more fully shown in FIG. 8, and in a way equivalent to that described above, with reference to FIGS. 1 and 7, in relation to the device 1, on the one hand, front electrical connection tracks 67, 68, 69 and 72 and the network 75 are produced, respectively in the locations 78, in the dielectric front layer 74 and, on the other hand, the back electrical connection track 73 is produced in the dielectric back layer 77.

Then the bumps 76 are placed in each location 78

Finally, the large wafer 82 obtained is singulated, along the edges of the locations 78, for example by sawing, so as to obtain a plurality of semiconductor devices 50.

In the two examples just described, being provided with a prefabricated passive component comprising several capacitors, only some of the capacitors could be connected, as a function of the chip 55 used and of the requirements related to the operation and applications of the latter.

According to a variant embodiment, a semiconductor device could comprise a passive component some of the capacitors of which would be connected in series or in parallel, so as to create a resultant capacitor connected to the chip.

According to a variant embodiment, a semiconductor device could comprise a passive component at least one of the capacitors of which would be directly connected to one of the external electrical connection bumps.

According to a variant embodiment, a semiconductor device could comprise a passive component at least one of the capacitors of which would be directly connected to another semiconductor device, for example stacked on its backside.

The present invention is not limited to the examples described above. Many other variant embodiments are possible without departing from the scope defined by the appended claims.

What is claimed is:

1. A semiconductor device, comprising:
   a wafer having a frontside and a backside and comprising:
      at least one integrated circuit chip having an electrical connection frontside,
      at least one passive component comprising a first conductive plate and a dielectric plate for forming parts of a capacitor, and
      an encapsulation block in which the integrated circuit chip and the first conductive plate of the passive component are embedded, wherein a frontside of the encapsulation block, the electrical connection frontside of the integrated circuit chip and a frontside of the dielectric plate are coplanar with each other to define the frontside of the wafer; and
   an electrical connection disposed directly on the frontside of the wafer, wherein the electrical connection comprises a single continuous planar conductive track consisting essentially of a first relatively wider portion disposed directly on the frontside of the dielectric plate to form a second conductive plate of the capacitor and a second relatively narrower portion disposed directly on the frontside of the encapsulation block and the electrical connection frontside of the integrated circuit chip to form a conducting line having an end directly electrically connected to the electrical connection frontside of the integrated circuit chip.

2. The device according to claim 1, in which the passive component further comprises a third conductive plate which extends parallel to the frontside of the wafer and is embedded within the encapsulation block.

3. The device according to claim 2, in which the passive component further comprises an additional dielectric plate embedded within the encapsulation block between the third conductive plate and the second conductive plate.

4. A semiconductor device, comprising:
an integrated circuit chip having an electrical connection frontside and a backside;
a capacitive structure comprising a first conductive plate and a first dielectric plate;
an encapsulating material layer surrounding the integrated circuit chip and capacitive structure, the encapsulating material layer having a frontside co-planar with the electrical connection frontside of the integrated circuit chip and co-planar with a frontside of the first dielectric plate and further having a backside co-planar with the backside of the integrated circuit chip; and
an electrical connection coupled to the electrical connection frontside of the integrated circuit chip, said electrical connection comprising:
a first connection line disposed directly on the co-planar frontside of the encapsulating material layer, said first connection line consisting of a relatively narrow proximal end portion in the form of a line having an end directly electrically connected to the integrated circuit chip and a relatively wide distal end portion in the form of a second conductive plate disposed directly on the dielectric plate, said end portions forming a single continuous metal structure;
a second connection line disposed directly on the co-planar backside of the encapsulating material; and
a first via passing through the encapsulating material layer to connect with the second connection line.

5. The device of claim 4, wherein the first conductive plate is oriented parallel to the frontside and backside of the encapsulating material layer.

6. The device of claim 5 wherein said electrical connection further comprises a second via passing through the encapsulating material layer between the second connection line formed on the co-planar backside of the encapsulating material layer and the first conductive plate.

7. The device of claim 6, wherein the capacitive structure further comprises another conductive plate embedded within the encapsulating material layer, further comprising another electrical connection between the electrical connection frontside of the integrated circuit chip and the another conductive plate, said another electrical connection comprising a connection line formed directly on the co-planar frontside of the encapsulating material layer.

8. A semiconductor device, comprising:
an integrated circuit chip having an electrical connection frontside;
a first conductive plate of a capacitor;
a first dielectric layer for said capacitor;
an encapsulation block configured to embed the integrated circuit chip, the first conductive plate and the first dielectric layer such that an electrical connection frontside of the integrated circuit chip, a frontside of the encapsulation block and a frontside of the first dielectric layer form a co-planar surface; and
a second conductive plate of the capacitor disposed directly on the frontside of the first dielectric layer, wherein the second conductive plate is a single continuous metal structure that consists of a relatively wider width portion and a conductive extension portion having a relatively narrower width disposed on the co-planar surface and having an end that makes direct electrical connection to the electrical connection frontside of the integrated circuit chip.

9. The device of claim 8, further comprising a third conductive plate of the capacitor disposed directly on the frontside of the first dielectric layer adjacent the second conductive plate, wherein the third conductive plate has a relatively wider width and includes a conductive extension having a relatively narrower width disposed on the co-planar surface to make electrical connection to the electrical connection frontside of the integrated circuit chip.

10. The device of claim 8, further comprising:
a third conductive plate of the capacitor embedded within the encapsulation block; and
an additional electrical connection between the integrated circuit chip and the third conductive plate.

* * * * *